(12) United States Patent
Powell et al.

(10) Patent No.: US 10,476,500 B2
(45) Date of Patent: Nov. 12, 2019

(54) REDUCING ERRONEOUS DETECTION OF INPUT COMMAND GESTURES

(71) Applicant: Jaguar Land Rover Limited, Coventry, Warwickshire (GB)

(72) Inventors: Richard Powell, Coventry (GB); Urmila Mistry, Coventry (GB); Laura Millen, Coventry (GB)

(73) Assignee: Jaguar Land Rover Limited, Coventry, Warwickshire (GB)

( * ) Notice: Subject to any disclaimer, the term of this patent is extended or adjusted under 35 U.S.C. 154(b) by 82 days.

(21) Appl. No.: 15/554,487

(22) PCT Filed: Mar. 18, 2016

(86) PCT No.: PCT/EP2016/055923
§ 371 (c)(1),
(2) Date: Aug. 30, 2017

(87) PCT Pub. No.: WO2016/146805
PCT Pub. Date: Sep. 22, 2016

(65) Prior Publication Data
US 2018/0069548 A1 Mar. 8, 2018

(30) Foreign Application Priority Data
Mar. 18, 2015 (GB) .................................. 1504602.2

(51) Int. Cl.
*H03K 17/94* (2006.01)
*B60R 16/037* (2006.01)
(52) U.S. Cl.
CPC ......... *H03K 17/943* (2013.01); *B60R 16/037* (2013.01); *H03K 2217/94036* (2013.01);
(Continued)

(58) Field of Classification Search
CPC ....... H03K 17/943; H03K 2217/94116; H03K 2217/94036; H03K 2217/94052;
(Continued)

(56) References Cited

U.S. PATENT DOCUMENTS

2005/0162115 A1 7/2005 Pendergrass
2007/0244613 A1* 10/2007 Ishikawa ............... B60K 37/06
701/29.2
(Continued)

FOREIGN PATENT DOCUMENTS

CN 103577075 A 2/2014
CN 103929167 A 7/2014
(Continued)

OTHER PUBLICATIONS

Patents Act 1977: Combined Search and Examination Report under Sections 17 and 18(3), GB Application No. GB1504602.2, dated Jun. 30, 2015, 8 pp.
(Continued)

*Primary Examiner* — Kimberly S Berona
*Assistant Examiner* — Michael V Kerrigan
(74) *Attorney, Agent, or Firm* — Myers Bigel, P.A.

(57) ABSTRACT

Embodiments of the present invention provide for a system and method for reducing erroneous detection of input command gestures. The method is performed by the system and includes storing a reference time value of when a presence of a human body part is detected by a first sensor and storing a further time value of when a presence of a human body part is detected by a second sensor. The reference time value and further time value are compared to provide a difference value which is used to determine a valid occurrence of an input command gesture.

20 Claims, 8 Drawing Sheets

(52) U.S. Cl.
CPC .............. *H03K 2217/94052* (2013.01); *H03K 2217/94116* (2013.01)

(58) Field of Classification Search
CPC ... B60R 16/037; B60R 16/023; B60R 25/245; H04W 52/0245; H04W 52/0219; H04W 52/0216; H04W 52/28; H04W 84/10; H04M 1/6091; H04M 2250/04; Y02D 70/10; Y02D 70/142; Y02D 70/00; Y02D 70/144
See application file for complete search history.

(56) References Cited

U.S. PATENT DOCUMENTS

| | | |
|---|---|---|
| 2013/0241691 A1 | 9/2013 | Moenkemueller |
| 2014/0015595 A1 | 1/2014 | Van Ausdall et al. |
| 2015/0002175 A1 | 1/2015 | Van Gastel |

FOREIGN PATENT DOCUMENTS

| | | |
|---|---|---|
| DE | 10 2012 105 363 | 12/2013 |
| EP | 1 854 656 A2 | 11/2007 |
| GB | 2 418 741 A | 4/2006 |

OTHER PUBLICATIONS

Patents Act 1977: Combined Search and Examination Report under Sections 17 and 18(3), GB Application No. GB1604593.2, dated Aug. 5, 2016, 9 pp.

International Search Report and Written Opinion of the International Searching Authority, International Application No. PCT/EP2016/055923, dated Jun. 3, 2016, 16 pp.

\* cited by examiner

REDUCING ERRONEOUS DETECTION OF INPUT COMMAND GESTURES

RELATED APPLICATIONS

This application is a 35 U.S.C. § 371 national stage application of PCT Application No. PCT/EP2016/055923, filed on Mar. 18, 2016, which claims priority from Great Britain Patent Application No. 1504602.2 filed on Mar. 18, 2015, the contents of which are incorporated herein by reference in their entireties. The above-referenced PCT International Application was published in the English language as International Publication No. WO 2016/146805 A1 on Sep. 22, 2016.

TECHNICAL FIELD

The present disclosure relates to a method for use in a vehicle and an apparatus for reducing erroneous detection of input command gestures. In particular, although not exclusively, embodiments of the invention relate to a method and apparatus for reducing erroneous input command gesture detection in applications used for controlling movement of a component of the vehicle.

BACKGROUND

It is known to provide numerous components of a vehicle which are operable responsive to a user command. Such components include a roof of a vehicle, a portion of a roof of the vehicle, a sunroof, windows of the vehicle, air vents, a boot or tailgate of the vehicle etc. Often such components are moved by an actuator which may be electrically operated, such as a motor, or hydraulically operated. The actuator is operable responsive to user operation of a corresponding switch.

The switch may have a range of movement encompassing two stages. A first stage corresponding to limited or part actuation of the switch causes the actuator to move only for as long as the switch is actuated. In this so-called manual mode of operation the user is able to move the component a limited distance, for example to partly open a roof, sunroof or window of the vehicle. A second stage, which may correspond to full operation of the switch, causes the actuator to move the component to a maximum extent of the components movement, such as fully open or closed. In this way the user can selectively operate the switch to cause a desired amount of movement of the component.

Gesture detection sensors can replace conventional switches in order to operate components of a vehicle. Such sensors can be useful, especially for drivers, who can simply move one of their arms into a detection zone of a gesture sensor to achieve a desired operation of a component. However, such components may be inadvertently or accidentally actuated due to erroneous detection of gesture commands.

It is an aim of embodiments of the invention to at least mitigate one or more of the problems of the prior art.

SUMMARY OF THE INVENTION

According to an aspect of the invention, there is provided a method for reducing erroneous detection of input command gestures. The method may comprise detecting with a first sensor means a presence of a human body part. The method may comprise storing a reference time value of when the detecting by the first sensor means occurred. The method may comprise detecting with at least one second sensor means a presence of the human body part. The method may comprise storing a further time value of when the detecting by the second sensor means occurred. The method may comprise comparing the reference time value with the further time value to provide a difference value indicative a time duration. The method may comprise determining a valid occurrence of an input command gesture based on the difference value.

The method may include outputting a control signal to cause a device to be operated, wherein the outputting is in response to the determining.

The control signal may be created in response to adjusting a controller setting from a first setting to a second setting.

The control signal may control an actuator to move in a first direction.

The method may include detecting with the first sensor means another presence of the human body part. The method may comprise storing another reference time value of when the further detecting by the first sensor means occurred. The method may comprise further detecting with the second sensor means another presence of the human body part. The method may comprise storing another further time value of when the further detecting by the second sensor means occurred. The method may comprise comparing the another reference time value with the another further time value to provide second difference value indicative a second time duration. The method may comprise determining another valid occurrence of an input command gesture based on the second difference value.

The method may also include outputting another control signal to cause the device to be operated, wherein the outputting another control signal is in response to the further determining.

The another control signal may be created in response to adjusting the controller setting from the second setting to the first setting.

The another control signal may control the actuator to move in the second direction.

The first sensor means and second sensor means may comprise infra-red sensor means.

A detection range of the second sensor means may be greater than a detection range of the first sensor means. The first sensor means detection range may be a sub-range of the second sensor means detection range.

The at least one second sensor means may include two spaced sensor means and wherein the first sensor is interposed between the two spaced sensors and wherein the operating is dependent upon which of the two spaced sensor means detect the presence of the human body part.

The operating may comprise a movement of the device which is a component of the vehicle.

The component may be one of a sunroof, a foldable roof, a window, an adjustable seat or an air vent, an air-conditioning system or an air vent of the vehicle.

According to another aspect of the invention, there is provided a system for reducing erroneous detection of input command gestures. The system may comprise a first sensor means and at least one second sensor means both being operatively coupled to a control means. The system may be configured to perform one or more steps comprising: detecting with the first sensor means a presence of a human body part; storing in the control means a reference time value of when the detecting by the first sensor means occurred; detecting with the at least one second sensor means a presence of the human body part; storing in the control means a further time value of when the detecting by the second sensor means occurred; comparing by the control means the reference time value with the further time value to provide a difference value indicative a time duration; and determining by the control means a valid occurrence of an input command gesture based on the difference value.

The control unit may be arranged to output a control signal to cause a device to be operated.

The control signal may be created in response to adjusting a controller setting from a first setting to a second setting.

The system may include the device that includes an actuator and the operating may include controlling the actuator to move in a first direction.

The system may be configured to perform the steps comprising one or more of further detecting with the first sensor means another presence of the human body part; storing another reference time value of when the further detecting by the first sensor means occurred; further detecting with the second sensor means another presence of the human body part; storing in the control means another further time value of when the further detecting by the second sensor means occurred; comparing by the control means the another reference time value with the another further time value to provide second difference value indicative a second time duration; and further determining by the control means another valid occurrence of an input command gesture based on the second difference value.

The control unit may be further arranged to cause the device to be operated, wherein the outputting another control signal is in response to the further determining.

The another control signal may be created in response to adjusting the controller setting from the second setting to the first setting.

The another control signal may controls the actuator to move in the second direction.

The first sensor means and second sensor means may be infra-red sensor means.

The second sensor means may include two spaced sensor means. The first sensor may be interposed between the two spaced sensors. The device that is operated may be dependent upon which of the two spaced sensor means detect the presence of the human body part.

Typically, the system may be integrated into a vehicle.

The device may be a component of the vehicle.

The component may comprise one of a sunroof, a foldable roof, a window, an adjustable seat or an air vent, an air-conditioning system or an air vent of the vehicle.

According to another aspect of the invention, there is provided a method for reducing erroneous detection of input command gestures, the method comprising: obtaining an output from a gesture sensor means indicating detection of a presence of a human body part; storing a time of the indicated detection by the gesture sensor means as a reference time value; obtaining an output from a gesture validation sensor means indicating detection of a presence of the human body part; storing a time of the indicated detection by the gesture validation sensor means as a further time value; comparing the reference time value with the further time value to provide a difference value indicative of a time duration; and determining a valid occurrence of an input command gesture based on the difference value.

The step of obtaining the output from the gesture validation sensor means may be implemented only after the output from the gesture sensor means has indicated detection of the presence of the human body part.

According to another aspect of the invention, there is provided a vehicle comprising the system as recited above.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

Embodiments of the invention will now be described, by way of example only, with reference to the accompanying figures, in which.

DETAILED DESCRIPTION

Figure 1:
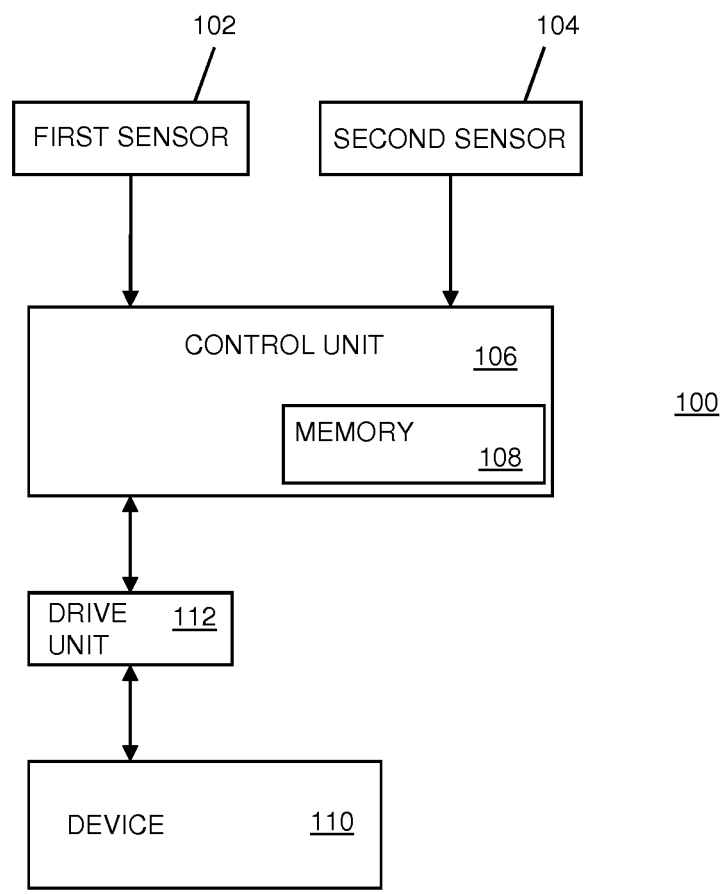
FIG. 1 illustrates a block diagram of a system for reducing erroneous detection of input command gestures, according to an embodiment of the invention.

FIG. 1 illustrates a block diagram of a system 100 for reducing erroneous detection of input command gestures, according to an embodiment of the invention. The system 100 includes a first sensor 102 and at least one second sensor 104 both being operatively coupled to a control unit 106. The control unit 106 includes a memory 108 for both storing operating code for the system 100 and for storing signals sent from the first sensor 102 and second sensor 104.

The system 100 is typically integrated into a vehicle and the system includes a device 110 coupled to the control unit 106 via a drive unit 112. The device 110 includes an actuator such as a motor, hydraulic ram or a pneumatic ram and the device 110 is a component of the vehicle Furthermore, the device 110 may be one of a sunroof, a foldable roof, a window, an adjustable seat, air-conditioning system or an air vent of the vehicle.

Figure 2:
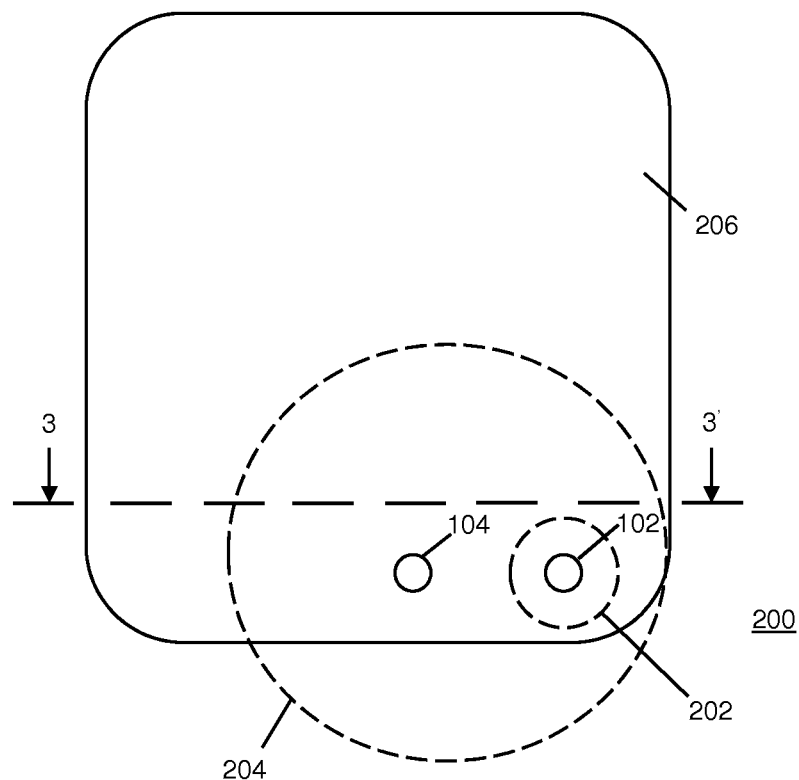
FIG. 2 illustrates a schematic plan view of a sensor assembly positioned on an underside of a roof of a vehicle, according to an embodiment of the invention.

Referring to FIG. 2 there is illustrated a schematic plan view of a sensor assembly 200 which may be positioned on an underside of a roof 206 of a vehicle, according to an embodiment of the invention. The sensor assembly 200 includes the first sensor 102 and a single second sensor 104 that are both operatively coupled to the control unit 106. The first sensor 102 may be designated as the gesture sensor, and the second 104 as the gesture validation sensor; in embodiments the purpose of the second sensor is to check that a detection of a gesture by the first/gesture sensor is not erroneous, for example using methods described below.

The first sensor 102 and second sensor 104 in certain embodiments may have the same range of detection. In the embodiment shown in FIG. 2, the first sensor 102, typically an infra-red sensor, has a first sensor detection range (or volume) 202 that can detect the presence of a human limb when within first sensor detection range 202. The second sensor 104, typically an infra-red sensor, has a second sensor detection range (or volume) 204 that can detect the presence of a human limb when within second sensor detection range 204. The ranges 202 and 204 may be considered as lobes or zones that monitor a volume of space around the respective sensors 102 and 104. The first sensor 102 and second sensor 104 are located proximal to each other typically with a small spacing of between 2 Centimeters to 10 Centimeters.

Figure 3:
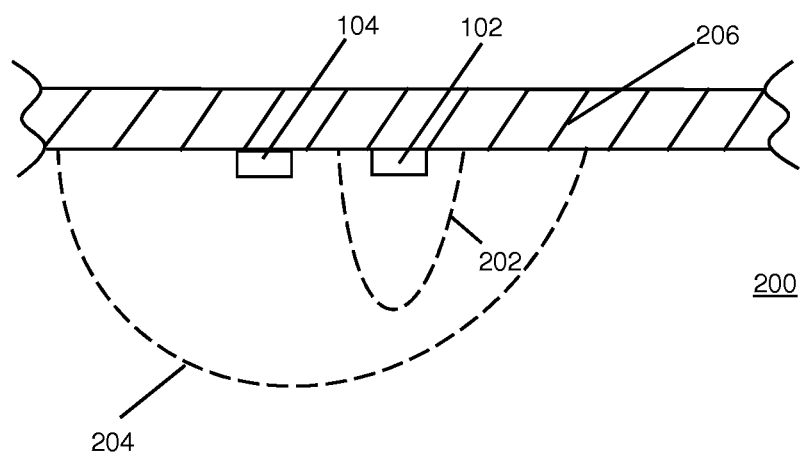
FIG. 3 illustrates a cross sectional view of the sensor assembly of FIG. 2, through 3-3, according to an embodiment of the invention.

Referring to FIG. 3 there is illustrated a cross sectional view of the sensor assembly 200, through line 3-3' of FIG. 2, according to an embodiment of the invention. As shown, in both FIGS. 2 and 3 the second sensor detection range 204 completely overlaps or encompasses, and is greater than, the first sensor detection range 202. In other words, the first sensor detection range 202 is a sub-range (or sub-volume) of the second sensor detection range 204 such that during normal operation the second sensor 104 may detect the presence of a human limb before the first sensor 102.

Depending on the circumstances of the interaction, and the arrangement of the sensors in embodiments of the invention, it may be that the first sensor to detect the presence may be the gesture sensor 102, or it may be the validation sensor 104. In embodiments, as described with reference to FIG. 9 below, the system may be operable to wait until a detection by the first/gesture sensor 102, before considering any input from the second/validation sensor 104. Thus the second/validation sensor 104 may have already detected the presence of a human limb, but this output will not be used until the first/gesture sensor 102 has registered a detection of the human limb.

Figure 4:
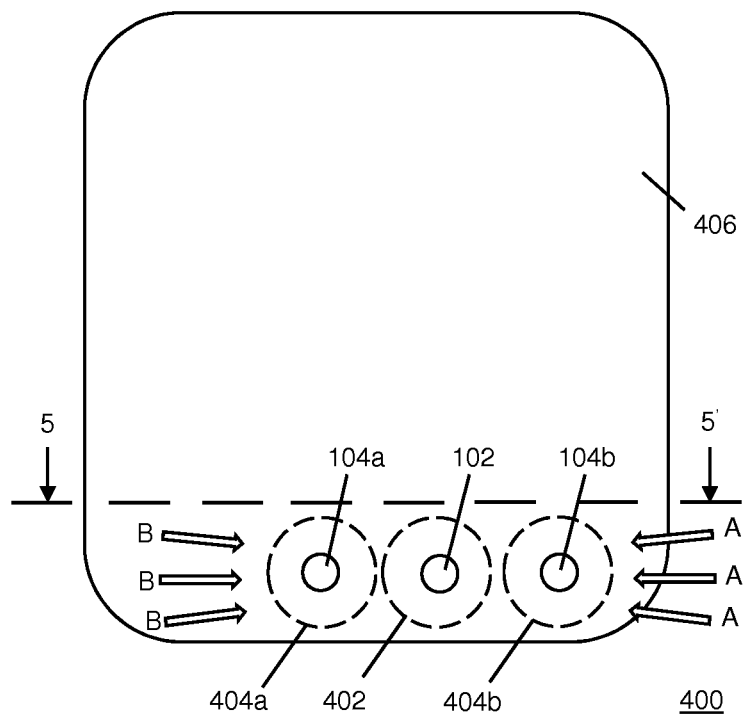
FIG. 4 illustrates a schematic plan view of another sensor assembly positioned on an underside of a roof of a vehicle, according to an embodiment of the invention

Referring to FIG. 4 there is illustrated a schematic plan view of another sensor assembly 400 positioned on an underside of a roof 406 of a vehicle, according to an embodiment of the invention. The sensor assembly 400 includes the first sensor 102 and there are two second sensors 104a and 104b all of which are operatively coupled to the control unit 106. The first sensor 102 is interposed between the two spaced second sensors 104a and 104b. Further, all the sensor employ the same sensing technology and the first sensor 102, typically an Infra-red sensor, has a first sensor detection range 402 that can detect the presence of a human limb when within first sensor detection range 402. Both second sensors 104a, 104b are typically Infra-red sensors that have respective second sensor detection ranges 404a, 404b that can detect the presence of a human limb within their respective ranges 404a, 404b. All the ranges 404a, 404b and 402 may be considered as lobes or zones that monitor a volume of space around the respective sensors 104a, 104b and 102. Both second sensors 104a, 104b are located proximal to the first sensor 102 each typically with a small spacing of between 2 Centimeters to 10 Centimeters. During normal operation, one of the second sensors 104a, 104b is arranged to detect the presence of a human limb before the first sensor 102 when the limb approaches the sensor assembly 400 in directions represented by arrows A or B.

Figure 5:
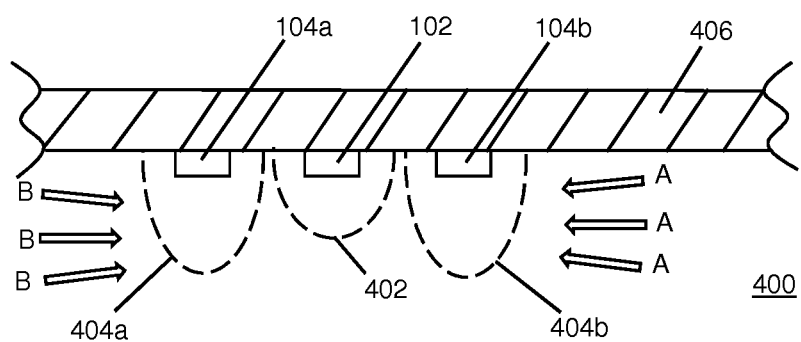
FIG. 5 illustrates a cross sectional view of the sensor assembly of FIG. 4, through 5-5', according to an embodiment of the invention.

Referring to FIG. 5 there is illustrated a cross sectional view of the sensor assembly 400, through 5-5', according to an embodiment of the invention. As shown, in both FIGS. 4 and 5 the second sensor detection ranges 404a, 404b sandwich the first sensor detection range 402 and act as downwardly extending curtains that at least partially surround the first sensor detection range 402. As a result, during normal operation, one of the second sensors 104a, 104b is arranged to detect the presence of a human limb before the first sensor 102 when the limb approaches the sensor assembly 400 in directions represented by the arrows A or B.

Figure 6:
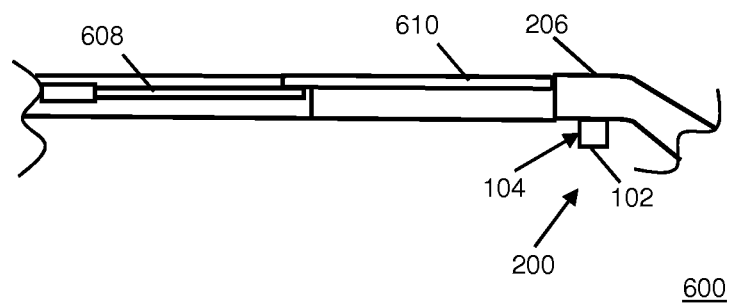
FIG. 6 illustrates a schematic view of part of a vehicle including an end view of the sensor assembly of FIG. 2 arranged to control closing and opening of a sunroof, according to an embodiment of the invention.

In FIG. 6 there is illustrated a schematic view of part of a vehicle 600 including an end view of the sensor assembly 200 arranged to control closing and opening of a sunroof 610 in the roof 206, according to an embodiment of the invention. As shown, the sunroof 610 is in a closed position, and there is an actuator 608, typically a hydraulic arm or a motor and chain mechanism, coupled to the sunroof 610.

Figure 7:
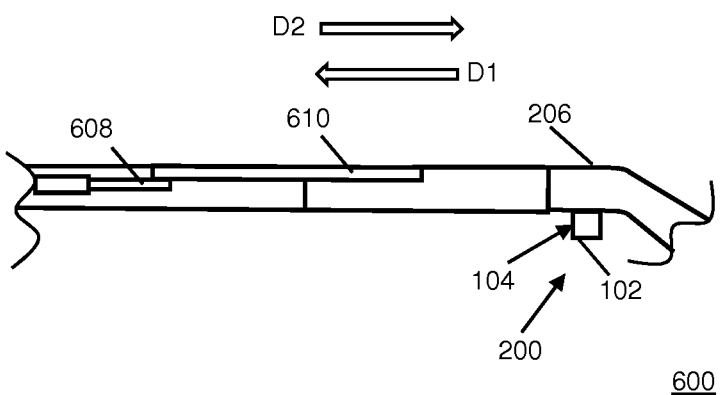
FIG. 7 illustrates a schematic view showing movement directions of the sunroof of FIG. 6, according to an embodiment of the invention.

Referring to FIG. 7 there is illustrated a schematic view showing movement directions of the sunroof 610, according to an embodiment of the invention. In operation, when the actuator 608 moves in a first direction D1, the sunroof 610 (device) moves to an open position. Conversely, when the actuator 608 moves in a second direction D2, the sunroof 610 (device) moves to the closed position.

Figure 8:
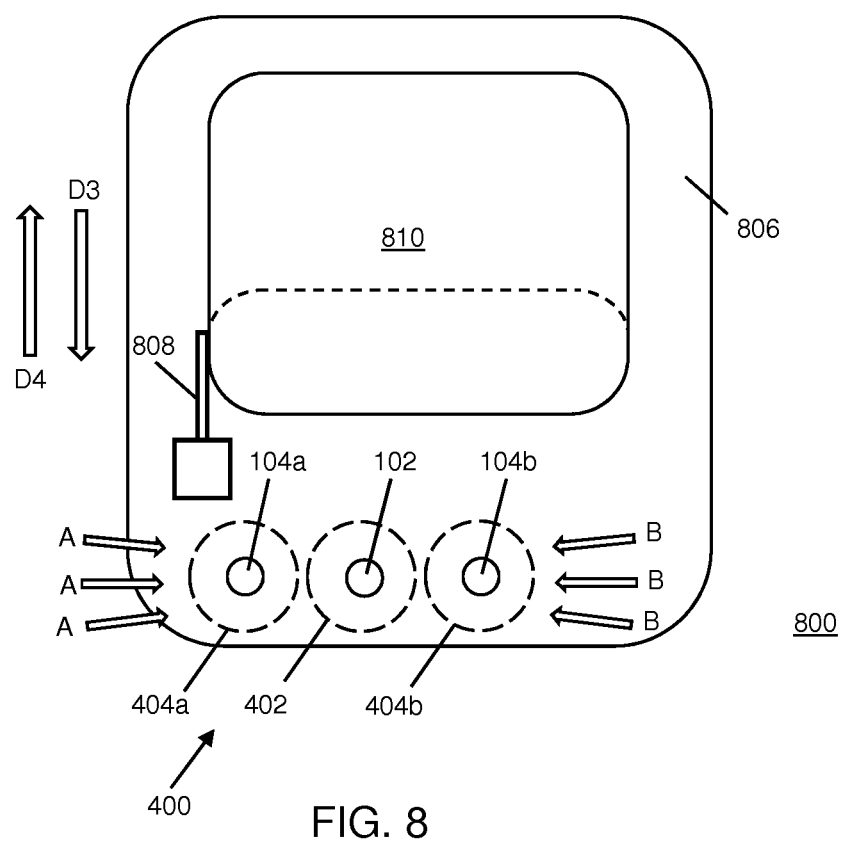
FIG. 8 illustrates a schematic view of part of a vehicle including the sensor assembly of FIG. 4 positioned on an inside of a door panel of the vehicle, according to an embodiment of the invention.

In FIG. 8 there is illustrated a schematic view of part of a vehicle 800 including the sensor assembly 400 positioned on an inside of a door panel of the vehicle, according to an embodiment of the invention. As shown, there is a window 810 in the door panel 806. The window 810 is in a closed position and an actuator 808, typically a hydraulic arm or a motor and chain mechanism, is coupled to the window 810. During normal operation, one of the second sensors 104a, 104b are arranged to detect the presence of a human limb before the first sensor 102 when the limb approaches the sensor assembly 400 in directions represented by arrows A or B. Also, in operation, when the actuator 808 moves in a first direction D3 the window 810 (device) moves to an open position as shown in phantom. Conversely, when the actuator 808 moves in a second direction D4, the window 810 (device) moves to the closed position.

Figure 9:
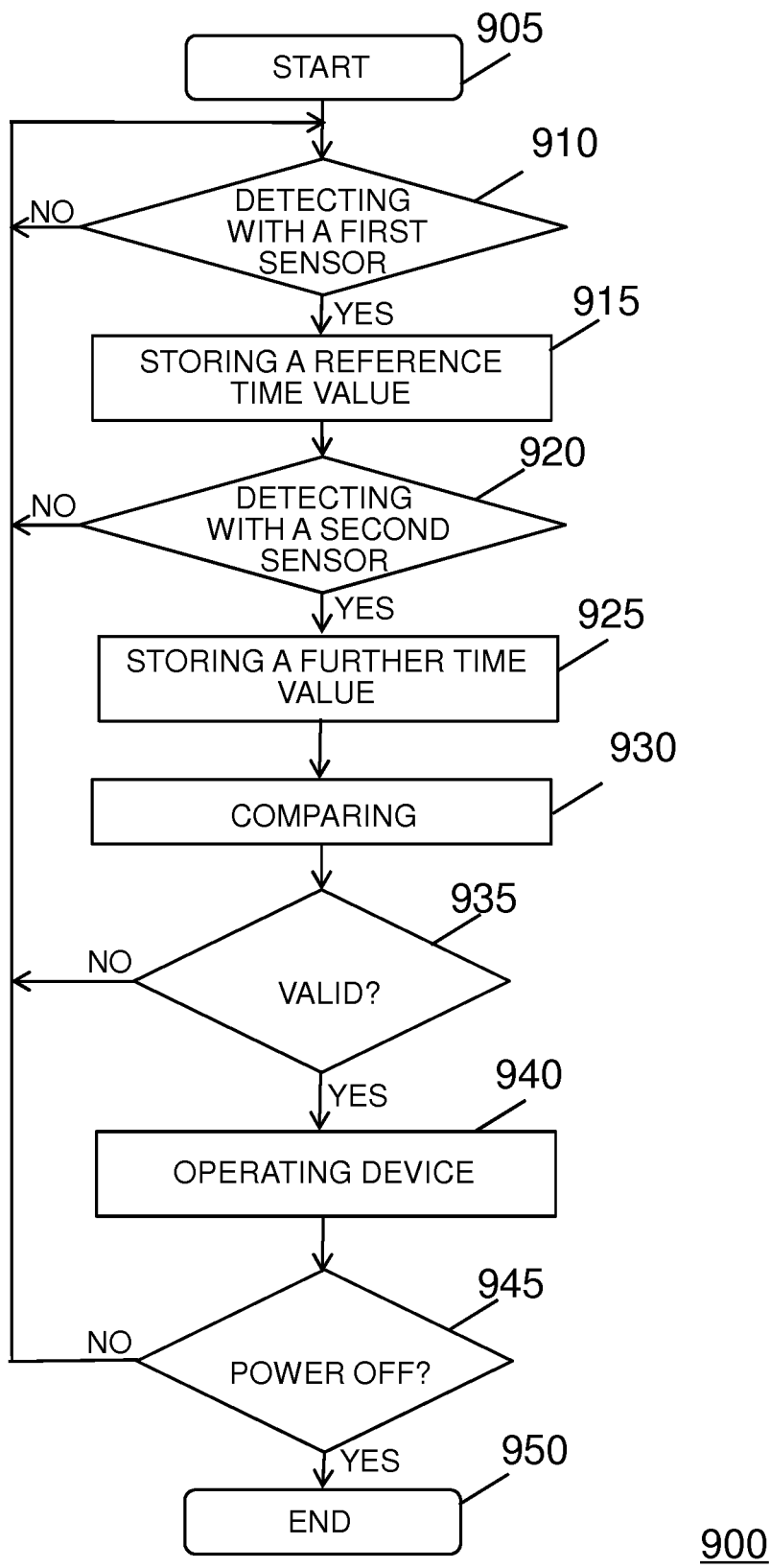
FIG. 9 is a flow chart illustrating a method for reducing erroneous detection of input command gestures, according to an embodiment of the invention.

Referring to FIG. 9 there is a flow chart illustrating a method 900 for reducing erroneous detection of input command gestures, according to an embodiment of the invention. The method 900, is a computer implemented method, typically performed on the system 100 and by way of example only the method 900 will be described with reference to the system 100. Upon power up of the system 100, typically by inserting a key or code into an ignition key of a vehicle incorporating the system 100, the method 900 is initiated at a start block 905. At a detecting block 910 the method 900 provides for detecting, with the first sensor 102, a presence of a human body part entering the first sensor detection range (zone) 202. The method 900 keeps repeating this process of detection (usually by an interrupt routine) until the first sensor 102 detects a presence of a human body part. At a block 915, there is performed a storing of a reference time value T1 indicative of when the detecting by the first sensor 102 occurred. Next, at another detecting block 920 the method 900 provides for detecting with at least the one second sensor 104 a presence of the human body part entering the second sensor detection range 204 (zone). If there is no detection within a specified maximum threshold time period THMAX, for instance 1 second, the method 100 returns to the detecting block 910 and no gesture command is recognised. Thus, it is presumed that there was a human body part that was accidentally, or inadvertently, detected by the first sensor 102 and the method 900 waits for the first sensor 102 to detect another presence of a human body part entering the first sensor detection range 202.

If at the detecting block 920 the second sensor 104 detects a presence of the human body part entering the second sensor detection range 204, then the method 900 proceeds to a storing block 925. At the storing block 925, there is performed a storing of a further time value T2 indicative of when the detecting by the at least one second sensor 104 occurred. Next at a comparing block 930 there is performed a process of comparing the reference time value T1 with the further time value T2 to provide a difference value DV indicative a time duration. Typically the difference value DV is obtained by a subtraction of the further time value T2 from the reference time value T1.

At a determining block 935 a valid occurrence of an input command gesture based on the difference value DV is determined. More specifically, if the difference value DV is greater than a minimum threshold time period THMIN (for example 0.25 seconds), but less than the maximum threshold time period THMAX, then a valid occurrence of an input command gesture is determined to have occurred. Otherwise no detection of an input command gesture is determined and the method 900 returns to block 910. However, when a valid occurrence of an input command gesture is determined to have occurred the method 900, at an operating block 940, generates a control signal to cause the device 110 to be operated. Thus, the control signal operates/controls the device 110 in response to the determining of block 935. In one example the operating includes adjusting a controller setting of the device 110 from a first setting to a second setting such as adjusting a volume control of a multimedia player. In another example the operating includes controlling an actuator, such as actuator 608, to move in a first direction and for instance move the sunroof 610 in the first direction D1.

If at a block 945 the ignition key of a vehicle incorporating the system 100 is turned off, the method 900 ends at an end block 950. Alternatively, the method 900 returns to block 910 and performs a process of further detecting, with the first sensor 102, a presence of a human body part entering the first sensor detection range 202. The method 900 again keeps repeating this process of detection (usually by an interrupt routine) until the first sensor 102 detects a presence of a human body part. At block 915, there is performed a storing of another reference time value T3 indicative of when the further detecting by the first sensor 102 occurred. Next, at the detecting block 920 the method 900 provides for further detecting with at least the one second sensor 104 another presence of the human body part entering the second sensor detection range 204. Again, if there is no detection within the specified maximum threshold time period THMAX, the method 100 returns to the detecting block 910 and no gesture command is recognised.

If at the detecting block 920 the second sensor 104 further detects the another presence of the human body part entering the second sensor detection range 204, then the method 900 proceeds to a storing block 925. At the storing block 925, there is performed a storing of another further time value T4 indicative of when the detecting by the at least one second sensor 104 occurred. Next at the comparing block 930 there is performed a process of comparing the another reference time value T3 with the another further time value T4 to provide a second difference value DV2 indicative a time duration. Typically the second difference value DV2 is obtained by a subtraction of the another further time value T4 from the another reference time value T3.

At the determining block 935 a valid occurrence of an input command gesture based on the second difference value DV2 is further determined. If the second difference value DV is greater than the minimum threshold time period THMIN, but less than the maximum threshold time period THMAX, then a valid occurrence of an input command gesture is determined to have occurred. Otherwise no detection of an input command gesture is determined and the method 900 returns to block 910. Alternatively, when a valid occurrence of an input command gesture is determined to have occurred the method 900, at a block 940, performs outputting another control signal to cause the device to be further operated and thus the device 110 is further operated in response to the determining of block 935. In one example the operating includes adjusting a controller setting of the device 110 from the second setting to the first setting. In another example the further operating includes controlling an actuator, such as actuator 608, to move in a second direction and for instance move the sunroof 610 in the second direction D2.

Figure 10:
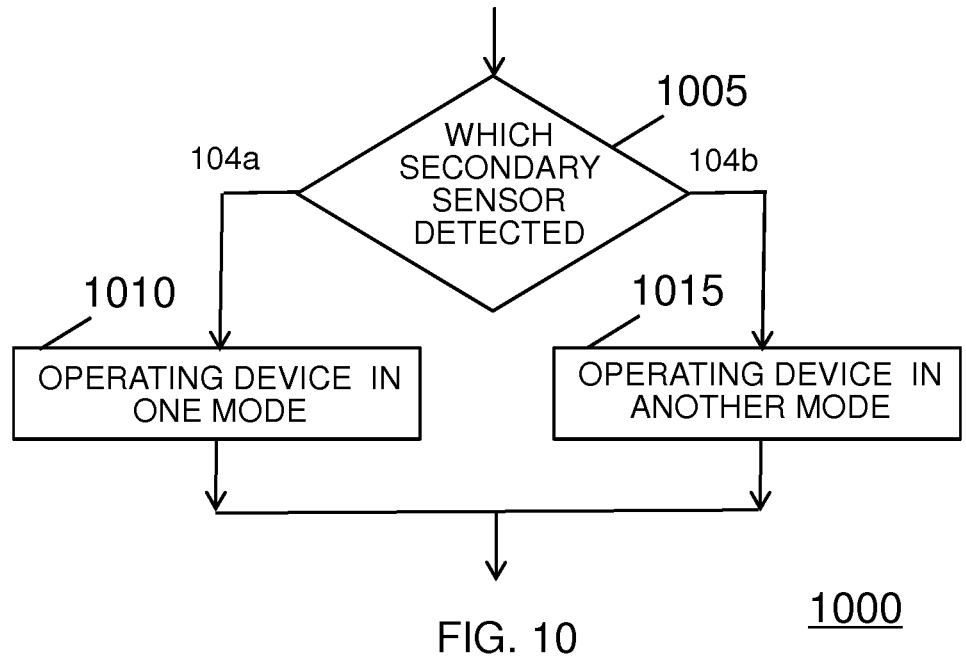
FIG. 10 is a flow chart illustrating one example of an operating flow process of an operating block of FIG. 9, according to an embodiment of the invention.

Referring to FIG. 10 there is flow chart illustrating one example of an operating flow process 1000 of the operating block 940, according to an embodiment of the invention. The process 1000 is typically implemented using the two spaced second sensors 104a, 104b disposed either side of the first sensor 102 such as the arrangement illustrated in FIGS. 4 and 5. At a determining block 1005 the system 100 determines which of the second sensors 104a, 104b detects the presence of the human body part. The process proceeds to either a block 1010 or block 1015 depending on which of the second sensors 104a, 104b detects the presence of the human body part. Block 1010 operates the device 110 in one mode (i.e. moving actuator 608 in direction D1) and block 1015 110 in one mode (i.e. moving actuator 608 in direction D2). Thus in this example the operating of block 940 is dependent upon which of the two spaced sensors detect the presence of the human body part and thus may be used for gesturing of opening and closing of devices of a vehicle.

Figure 11:
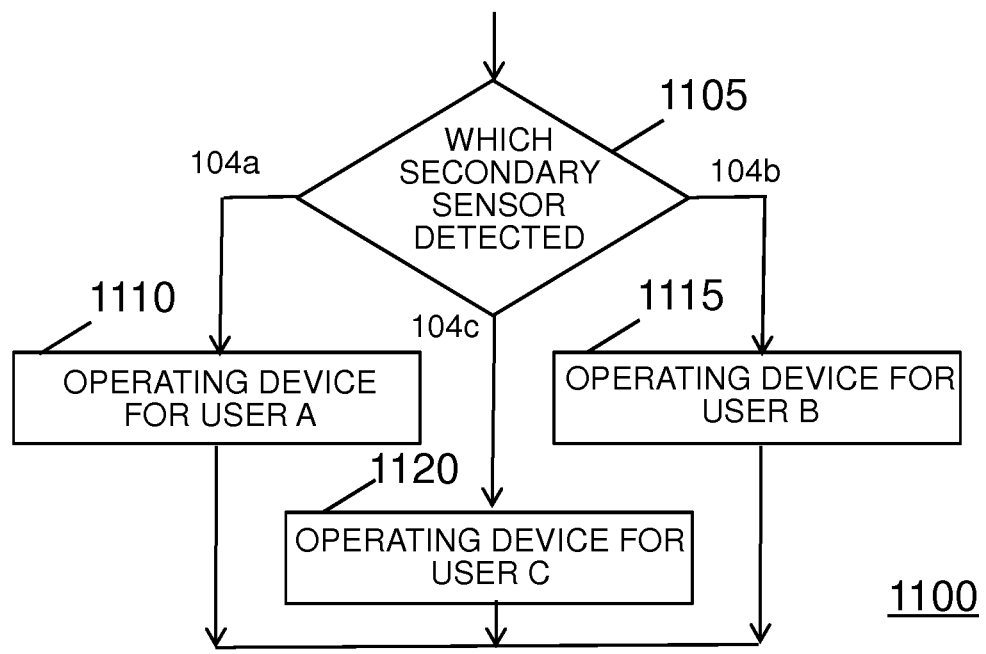
FIG. 11 is a flow chart illustrating another example of an operating flow process of an operating block of FIG. 9, according to an embodiment of the invention.

Referring to FIG. 11 there is flow chart illustrating another example of an operating flow process 1100 of the operating block 940, according to an embodiment of the invention. The process 1100 is typically implemented using three or more spaced second sensors 104a, 104b, 104c disposed around the first sensor 102. At a determining block 1105 the system 100 determines which of the second sensors 104a, 104b, 104c detects the presence of the human body part. The process proceeds to one of blocks 1110, 1115 or 1120 depending on which of the second sensors 104a, 104b 104c detects the presence of the human body part. Block 1110 operates a device 110 for a first user (user A) such as opening and closing a front passenger window of a vehicle, block 1115 operates a device 110 for a second user (user B) such as opening and closing a driver's window, and 1110 operates a device 110 for a third user (user C) such as opening and closing a rear passenger window of a vehicle. Thus again in this example the operating of block 940 is dependent upon which of the two spaced sensors detect the presence of the human body part.

Figure 12:
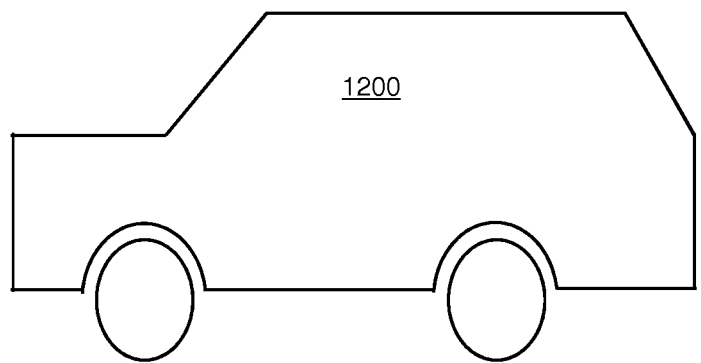
FIG. 12 shows a vehicle comprising a sensor assembly according to an embodiment of the invention.

In FIG. 12 a vehicle 1200 is disclosed, the vehicle may comprise, amongst other features, a sensor assembly according to an embodiment of the invention.

Advantageously, the invention provides for at least reducing erroneous detection of gestures caused by noise, interference or movement of people (such as passengers in a vehicle). The erroneous detection is reduced by determining a valid occurrence of an input command gesture based on the difference value DV and thus inadvertent or accidental actuation of components can be at least alleviated.

It will be appreciated that embodiments of the present invention can be realised in the form of hardware, software or a combination of hardware and software and may be implemented with a computer. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

Further aspects of the invention are set out in the following numbered paragraphs:

1. A method for reducing erroneous detection of input command gestures, the method comprising:
   detecting with a first sensor a presence of a human body part;
   storing a reference time value of when the detecting by the first sensor occurred;
   detecting with at least one second sensor a presence of the human body part;
   storing a further time value of when the detecting by the second sensor occurred;
   comparing the reference time value with the further time value to provide a difference value indicative of a time duration; and
   determining a valid occurrence of an input command gesture based on the difference value.
2. The method of paragraph 1, further including outputting a control signal to cause a device to be operated, wherein the outputting is in response to the determining.
3. The method of paragraph 2, wherein the control signal is created in response to adjusting a controller setting from a first setting to a second setting.
4. The method of paragraph 2, wherein the control signal controls an actuator to move in a first direction.
5. The method of paragraph 1 including:
   further detecting with the first sensor another presence of the human body part;
   storing another reference time value of when the further detecting by the first sensor occurred;
   further detecting with the second sensor another presence of the human body part;
   storing another further time value of when the further detecting by the second sensor occurred;
   comparing the another reference time value with the another further time value to provide second difference value indicative a second time duration; and
   further determining another valid occurrence of an input command gesture based on the second difference value.
6. The method of paragraph 5, including outputting another control signal to cause the device to be operated, wherein the outputting another control signal is in response to the further determining.
7. The method of paragraph 6, wherein the another control signal is created in response to adjusting the controller setting from the second setting to the first setting.
8. The method of paragraph 7, wherein the another control signal controls the actuator to move in a second direction.
9. The method as of paragraph 1, wherein the first sensor and second sensor are infra-red sensors.
10. The method of paragraph 2, wherein the at least one second sensor includes two spaced sensors and wherein the first sensor is interposed between the two spaced sensors, and wherein the outputting a control signal is dependent upon which of the two spaced sensors detect the presence of the human body part.
11. The method of paragraph 2, wherein the operating is a movement of the device which is a component of the vehicle.
12. The method of paragraph 11, wherein the component is one of a sunroof, a foldable roof, a window, an adjustable seat, an air-conditioning system or an air vent of the vehicle.
13. A system for reducing erroneous detection of input command gestures, the system comprising a first sensor and at least one second sensor both being operatively coupled to a control unit, wherein the system is configured to perform the steps comprising:
   detecting with the first sensor a presence of a human body part;
   storing in the control unit a reference time value of when the detecting by the first sensor occurred;
   detecting with the at least one second sensor a presence of the human body part;

storing in the control unit a further time value of when the detecting by the second sensor occurred;
comparing by the control unit the reference time value with the further time value to provide a difference value indicative a time duration; and
determining by the control unit a valid occurrence of an input command gesture based on the difference value.

14. The system of paragraph 13, wherein the control unit is arranged to output a control signal to cause a device to be operated.

15. The system of paragraph 14 wherein the control signal is created in response to adjusting a controller setting from a first setting to a second setting.

16. The system of paragraph 14 wherein the system includes the device that includes an actuator and the operating includes controlling the actuator to move in a first direction.

17. The system of paragraph 14, wherein the system is configured to perform the steps comprising:
further detecting with the first sensor another presence of the human body part;
storing another reference time value of when the further detecting by the first sensor occurred;
further detecting with the second sensor another presence of the human body part;
storing in the control unit another further time value of when the further detecting by the second sensor occurred;
comparing by the control unit the another reference time value with the another further time value to provide second difference value indicative a second time duration; and
further determining by the control unit another valid occurrence of an input command gesture based on the second difference value.

18. The system of paragraph 17, wherein the control unit is arranged to cause the device to be operated, wherein the outputting another control signal is in response to the further determining.

19. The system of paragraph 17 wherein the another control signal is created in response to adjusting the controller setting from the second setting to the first setting.

20. The system of paragraph 17 wherein the another control signal controls the actuator to move in a second direction.

21. The system of paragraph 13, wherein the first sensor and second sensor are infra-red sensors.

22. The system of paragraph 14, wherein the least one second sensor includes two spaced sensors, and wherein the first sensor is interposed between the two spaced sensors, and wherein the device to be operated is dependent upon which of the two spaced sensors detect the presence of the human body part.

23. The system of paragraph 14, wherein the system is integrated into a vehicle.

24. The system of paragraph 23 wherein the device is a component of the vehicle.

25. The system of paragraph 24 wherein the component is one of a sunroof, a foldable roof, a window, an adjustable seat, an air-conditioning system or an air vent of the vehicle.

26. A vehicle comprising the system according to paragraph 13.

The invention claimed is:

1. A method for reducing erroneous detection of input command gestures, the method comprising:
detecting with a gesture sensor a presence of a human body part;
storing a reference time value of when the detecting with the gesture sensor occurred;
detecting with at least one validation sensor a presence of a human body part, wherein the at least one validation sensor has a detection volume that completely overlaps a detection volume of the gesture sensor;
storing a further time value of when the detecting with the at least one validation sensor occurred;
comparing the reference time value with the further time value to provide a difference value indicative of a time duration; and
determining a valid occurrence of an input command gesture detected by the gesture sensor based on the difference value.

2. The method of claim 1, further comprising outputting a control signal to cause a device to be operated, wherein the outputting the control signal is in response to the determining the valid occurrence of the input command gesture detected by the gesture sensor based on the difference value.

3. The method of claim 2, wherein the control signal controls an actuator to move in a first direction.

4. The method of claim 2, further comprising:
further detecting with the gesture sensor another presence of a human body part;
storing another reference time value of when the further detecting by the gesture sensor occurred;
further detecting with the at least one validation sensor another presence of a human body part;
storing another further time value of when the further detecting with the at least one validation sensor occurred;
comparing the another reference time value with the another further time value to provide a second difference value indicative of a second time duration; and
further determining another valid occurrence of an input command gesture detected at the gesture sensor based on the second difference value.

5. The method of claim 4, further comprising outputting another control signal to cause the device to be operated, wherein the outputting another control signal is in response to the further determining another valid occurrence of the input command gesture detected by the gesture sensor based on the second difference value.

6. The method of claim 5, wherein the another control signal is created in response to adjusting a controller setting from a second setting to a first setting.

7. The method of claim 6, wherein the another control signal controls an actuator to move in a second direction.

8. The method of claim 2, wherein the at least one validation sensor includes two spaced sensors, wherein the gesture sensor is interposed between the two spaced validation sensors, and wherein the outputting a control signal is dependent upon which of the two spaced validation sensors detect the presence of a human body part.

9. The method of claim 2, wherein the operating is a movement of the device which is a component of a vehicle.

10. The method of claim 1, wherein the gesture sensor and the at least one validation sensor are infra-red sensors.

11. A system for reducing erroneous detection of input command gestures, the system comprising:
a gesture sensor and at least one validation sensor, both operatively coupled to a control unit, wherein a detection volume of the at least one validation sensor completely overlaps a detection volume of the gesture sensor;
wherein the system is configured to perform the steps comprising:

detecting with the gesture sensor a presence of a human body part;

storing in the control unit a reference time value of when the detecting with the gesture sensor occurred;

detecting with the at least one validation sensor a presence of a human body part;

storing in the control unit a further time value of when the detecting with the at least one validation sensor occurred;

comparing by the control unit the reference time value with the further time value to provide a difference value indicative of a time duration; and determining by the control unit a valid occurrence of an input command gesture detected by the gesture sensor based on the difference value.

12. The system of claim 11, wherein the control unit is arranged to output a control signal to cause a device to be operated.

13. The system of claim 12, wherein the device comprises an actuator, and wherein the system is further configured to control the actuator to move in a first direction.

14. The system of claim 12, wherein the system is configured to perform the steps comprising:

further detecting with the gesture sensor another presence of a human body part;

storing in the control unit another reference time value of when the further detecting by the gesture sensor occurred;

further detecting with the at least one validation sensor another presence of a human body part;

storing in the control unit another further time value of when the further detecting with the at least one validation sensor occurred;

comparing by the control unit the another reference time value with the another further time value to provide a second difference value indicative of a second time duration; and further determining by the control unit another valid occurrence of an input command gesture detected by the gesture sensor based on the second difference value.

15. The system of claim 14, wherein the control unit is arranged to cause the device to be operated, wherein the outputting another control signal is in response to the further determining another valid occurrence of an input command gesture detected by the gesture sensor based on the second difference value.

16. The system of claim 15, wherein the another control signal controls an actuator to move in a second direction.

17. The system of claim 12, wherein the at least one validation sensor includes two spaced validation sensors, wherein the gesture sensor is interposed between the two spaced validation sensors, and wherein the device that is operated is dependent upon which of the two spaced validation sensors detect the presence of a human body part.

18. The system of claim 12, wherein the system is integrated into a vehicle.

19. The system of claim 11, wherein the gesture sensor and the at least one validation sensor are infra-red sensors.

20. A vehicle comprising the system of claim 11.

* * * * *